United States Patent [19]

Park

[11] Patent Number: 5,643,812
[45] Date of Patent: Jul. 1, 1997

[54] METHOD OF MAKING EEPROM FLASH MEMORY CELL WITH ERASE GATE

[75] Inventor: Keun Hyung Park, Seoul, Rep. of Korea

[73] Assignee: Goldstar Electron Co., Ltd., Cheongju, Rep. of Korea

[21] Appl. No.: 330,777

[22] Filed: Oct. 28, 1994

[30] Foreign Application Priority Data

Oct. 28, 1993 [KR] Rep. of Korea ............... 93-22629

[51] Int. Cl.⁶ .................. H01L 21/265; H01L 21/8247
[52] U.S. Cl. .................. 437/43; 437/48; 257/320
[58] Field of Search ............... 437/43, 48, 52; 257/316, 320

[56] References Cited

U.S. PATENT DOCUMENTS

| | | | |
|---|---|---|---|
| 5,151,375 | 9/1992 | Kazerounian et al. | 437/43 |
| 5,367,185 | 11/1994 | Fukumoto | 257/320 |
| 5,380,672 | 1/1995 | Yuan et al. | 437/43 |
| 5,418,741 | 5/1995 | Gill | 365/182 |
| 5,451,535 | 9/1995 | Chan et al. | 437/43 |

OTHER PUBLICATIONS

Virgil Niles Kynett, et al.,; "A 90–ns One–Million Erase/Program Cycle 1–Mbit Flash Memory"; IEEE Journal of Solid–State Circuits, vol. 24, No. 5, Oct. 1989; pp. 1259–1263.

Hitoshi Kume et al.; "A 3.42 μm² Flash Memory Cell Technology Conformable to a Sector Erase"; 8B-3; pp. 77–78, no date provided.

N. Kodama, et al.; "A 5Y Only 16 Mbit Flash EEPROM Cell Using Highly Reliable Write/Erase Technologies"; 8B-2; pp. 75–76, no date.

Sameer Haddad, et al.; "Degradations Due to Hole Trapping in Flash Memory Cells"; IEEE Electron Device Letters, vol. 10, No. 3, Mar. 1989, pp. 117–119.

T.C. Ong, et al.; "Erratic Erase in Etox™ Flash Memory Array"; 7A-2; pp. 83–84, no date provided.

N. Ajika, et al.; "A 5 Volt Only 16M Bit Flash EEPROM Cell With a Simple Stacked Gate Structure"; IEDM–115; pp. 5.7.1–5.7.4, 1990.

Primary Examiner—John Niebling
Assistant Examiner—Richard A. Booth
Attorney, Agent, or Firm—Alan Loudermilk

[57] ABSTRACT

An EEPROM flash memory cell and a process for formation thereof are disclosed. The EEPROM flash memory cell includes: a source; a drain; a gate insulating layer disposed upon a channel between the source and the drain; a floating gate electrode disposed upon the gate insulating layer and facing toward the channel; and a control gate electrode disposed upon the floating gate electrode across an intermediate insulating layer; and further includes, an erasing electrode for contacting with at least one side of the floating gate electrode at least at one or more spots thereof across a tunneling insulating layer.

12 Claims, 5 Drawing Sheets

METHOD OF MAKING EEPROM FLASH MEMORY CELL WITH ERASE GATE

FIELD OF THE INVENTION

The present invention relates to erasable and programmable memory cells, and more particularly to single transistor flash EEPROM memory cells, memory devices consisting of such memory cells, and processes for formation thereof.

BACKGROUND OF THE INVENTION

Semiconductor memories include volatile memories such as DRAM, SRAM and the like, and non-volatile memories such as mask ROM, EPROM, EEPROM and the like. Of the EEPROMs, there is the so-called flash memory, which has been developed and is in use at present, which has a single transistor per memory cell.

As illustrated in FIGS. 1, 2A and 2B, this flash memory is constituted such that floating gate 14 is disposed between the channel and the gate (called control gate) of a field effect transistor (FET) which consists of source 12, drain 11 and gate 13. Programming is carried out by injecting electrons into floating gate 14 or removing electrons from floating gate 14.

FIG. 2A is a sectional view taken along line 2A—2A of FIG. 1, and FIG. 2B is a sectional view taken along line 2B—2B of FIG. 1.

Floating gate 14 indicates the shaded areas in FIG. 1, and is provided with one for each cell, while a plurality of control gates 13 are provided in a continuous form. In the drawings, reference codes 15, 16 and 17 indicate insulating layers.

When writing (programming) into the flash EEPROM, that is, when injecting charges into the floating gate, the drain and the control gate are manipulated by supplying an appropriate voltage.

When programming (writing), a voltage of 7 to 8 volts is supplied to the drain, and a voltage of 12 to 13 volts is supplied to the control gate, so that hot electrons should be produced in the channel between the source and drain. Such hot electrons are pulled by the electric field of the voltage of the control gate, and pass through the insulating layer of the gate (tunneling) and are ultimately injected into the floating gate.

Thus, the floating gate is charged with negative charge, so that the threshold voltage of the transistor is raised. Consequently, the transistor is not turned on with the normal control gate voltage, and, therefore, the transistor remains in a turned off state during normal operation.

If the cell which thus has been programmed is to be erased, the control gate and the substrate are grounded, and the drain is made to float, while a positive voltage of 13 to 15 volts is supplied to the source. Thus, electrons tunnel (Fowler Nordheim tunneling) from the floating gate to the source, so that the floating gate should lose charge. Consequently, the threshold voltage of the transistor is lowered, and the programmed contents are erased.

Such a technique for a flash memory is described in the "Solid State Circuit" Journal published by IEEE (dated October 1989, Vol. 24, No. 5, pages 1259–1263) (A 90-ns One-Million Erase/Program Cycle 1-Mbit Flash Memory" by V. Kynett et al.). Such a technique is further described in a speech by H. Kume, et al., in a VLSI technique conference of 1991 under the title of "A 3142 [micron square] Flash Memory Cell Technology Conformable to a Sector Erase," which was published in the Digest of Technical Papers (pages 77–78). Such a technique is further described by N. Kodama et al., under the title of "A 5 V 16 M bit Flash EEPROM Cell Using Highly Reliable Write/Erase Technologies," which was published in the same publication (pages 75–76).

In such conventional techniques, junction breakdown can occur when erasing the programmed data.

In an attempt to prevent this phenomenon, as illustrated in FIG. 2B, source 12 is made in a dual form consisting of a high concentration impurity region N+ and a low concentration impurity region N–, so that a stepped junction should be formed, thereby raising the junction breakdown voltage of the source electrode. Such a technique with a source electrode having such a junction structure is disclosed in U.S. Pat. No. 4,698,787 (dated Oct. 6, 1987). Further, in order to solve the junction problem, U.S. Pat. No. 5,077,691 (dated Dec. 31, 1991) proposes the following. A voltage of 5 volts (Vcc) is supplied to the source, and a negative voltage of –11 to –13 volts is supplied to the control gate, thereby erasing the programmed cells.

In the above described conventional techniques, when erasing the recorded data from the cell, a high voltage is supplied to the source electrode relative to the control gate. Consequently, a deep depletion region is formed in the source, and electron-hole pairs are produced. These holes receive energy from the electric field in the deep depletion region to form hot holes. These hot holes are injected into the gate insulating layer, and are caught there. Consequently, during erasing, the tunneling current is increased, and therefore over-erasing occurs. Further, due to the hot holes, there are cases in which the threshold voltage variation increases too much. Such problems are described by S. Haddad et al., in "Degradation Due to Hole Trapping in Flash Memory Cells," published in IEEE Electron Device Letters (Volume 10, No. 3, pages 117–119, March 1989).

Further, in the conventional techniques, during programming or erasing, the gate oxide (indicated by reference code 20 in FIG. 2B) has to be maintained about 100 Angstroms in order for electrons to be tunneled. Consequently, the manufacturing process is fastidious, and the yield is low. Efforts are being made to increase the yield of flash memory devices by improving the quality of the tunneling oxide. For example, such efforts include reducing the level of capture of electrons and electron holes in the tunneling oxide, lowering the heavy metal contamination of the channel of the tunneling oxide and the source-drain region, inhibiting charging of the gate by the etching plasma, and the like. The yield with such techniques, however, still is low compared with DRAM and SRAM devices, and, the thinner the gate oxide, the more serious is the problem of gate disturbance, which increases the threshold voltage.

SUMMARY OF THE INVENTION

The present invention is intended to overcome the above described disadvantages of the conventional techniques. The present invention intends to provide a new EEPROM flash cell structure in which the programmed cell is erased not by electron tunneling from the floating gate to the source, but by electron tunneling from the floating gate to the erase gate, thereby making it possible to use a thick gate oxide (of about 160 to 460 Angstroms in thickness) comparable to that of standard EPROM technology.

Therefore, it is an object of the present invention to provide an EEPROM flash memory cell, an EEPROM flash memory device consisting of such memory cells, and a process for formation thereof, in which an erasing electrode is disposed between the flash memory cells in the direction crossing the word line, so that the erasing electrode should contact with at least one side of the floating gate across an insulating layer, whereby, during erasing, electrons tunnel through the insulating layer.

In achieving the above and other objects, the memory cell according to the present invention includes: a source; a drain; a gate insulating layer disposed upon a channel between the source and the drain; a floating gate electrode facing toward the channel over the gate insulating layer; and a control gate disposed over the floating gate electrode across an intermediate insulating layer. The memory cell according to the present invention further includes an erasing electrode disposed at least at one side of the floating gate electrode in such a manner that the erasing electrode should contact at least one or more spots of the floating gate electrode across the tunneling insulating layer.

The floating gate electrode, the control gate and the erasing electrode may be formed using polysilicon, and the gate insulating layer may consist of a silicon oxide film, while the intermediate insulating layer may be provided in the form of an ONO (silicon Oxide—silicon Nitride—silicon Oxide) stacked layer. The tunneling insulating layer may provide a good tunneling effect if it is formed by thermally oxidizing polysilicon, while the thickness of the tunneling insulating layer may be large, and preferably in the range of about 200 to 500 Angstroms.

The floating gate electrode may be deposited to a thickness of about 1000 to 2000 Angstroms, the control gate to a thickness of about 3000 Angstroms, and the erasing electrode to a thickness of about 2000 to 4000 Angstroms. The gate insulating layer may be formed to a thickness of about 150 to 400 Angstroms, and the effective oxide layer of the intermediate insulating layer may be provided to a thickness of about 150 to 400 Angstroms.

Further, the sources and drains are arranged in a first direction, and the floating gate electrodes are arranged between pairs of sources and drains, in such manner that the floating gate electrode faces toward the channel and is disposed upon the gate insulating layer between the source and drain. Further, the control gate electrode over the floating gate electrode across the intermediate insulating layer is disposed in a second direction which crosses the first direction. Further, the erasing electrode is disposed in the first direction.

In achieving the above objects, a process for formation of a memory cell according to the present invention may include the steps of: forming a field region and an element (active) region upon a semiconductor substrate in a separate form, forming a gate insulating layer, and fabricating a conduction pattern for forming a strip-type floating gate electrode; depositing an intermediate insulating layer, and sequentially depositing a conduction layer and an upper insulating layer for forming a control gate thereupon; defining the control gate, and forming the control gate by etching the upper insulating layer and the conduction layer by using the intermediate insulating layer as an etch stop layer; forming a side wall insulating layer on the side wall of the control gate by depositing an insulating layer and by etching it back; forming the floating gate electrode by etching back the floating gate conduction layer by using the upper insulating layer and the side wall insulating layer of the control gate as a mask; forming an N+ source-drain region by ion-implanting a high concentration impurity, forming a tunneling insulating layer on the exposed portion of the floating gate electrode, and diffusing the injected ions; and forming the erasing electrode by depositing an erasing electrode conduction layer and by patterning this layer.

Silicon oxide is deposited to a thickness of about 150 to 400 Angstroms for forming the gate insulating layer, and silicon oxide is deposited to a thickness of about 200 to 500 Angstroms for forming the tunneling insulating layer, these being much thicker than conventional such layers.

BRIEF DESCRIPTION OF THE DRAWINGS

The above objects and advantages of the present invention will become more apparent by describing in detail the preferred embodiments of the present invention with reference to the attached drawings in which.

DESCRIPTION OF THE PREFERRED EMBODIMENTS

Figure 1:
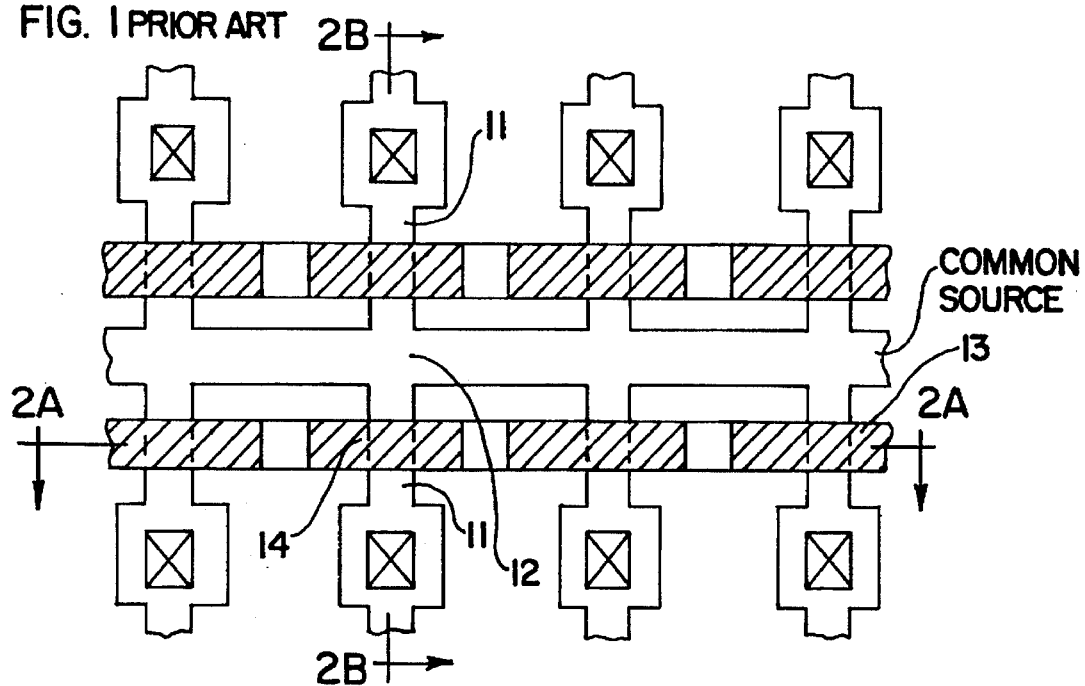
FIG. 1 illustrates the layout of a conventional EEPROM flash memory device.
Figure 2A:
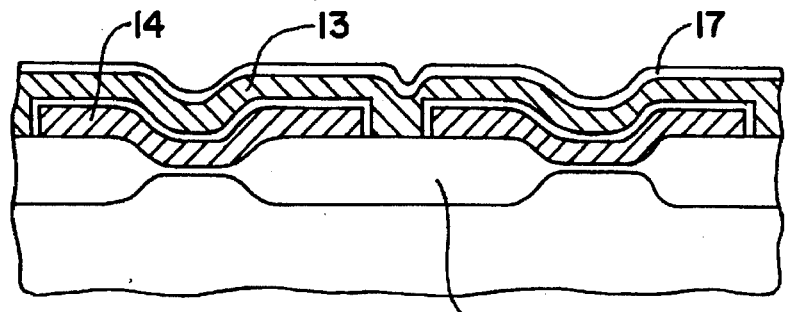
FIG. 2A is a sectional view taken along line 2A—2A of FIG. 1.
Figure 2B:
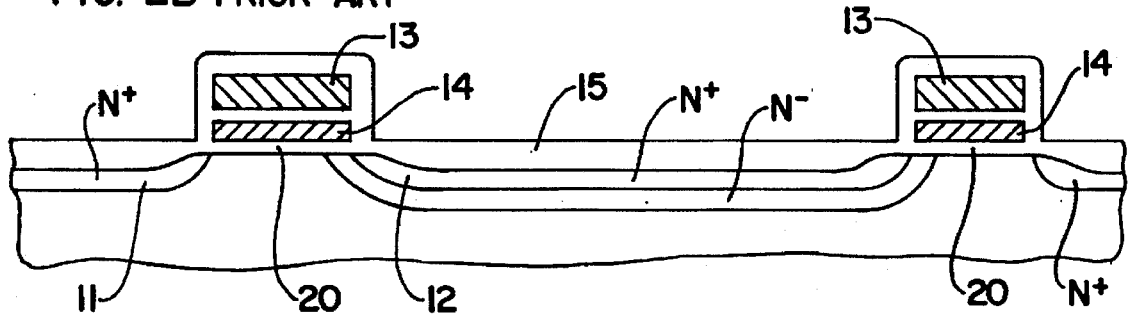
FIG. 2B is a sectional view taken along line 2B—2B of FIG. 1.
Figure 3:
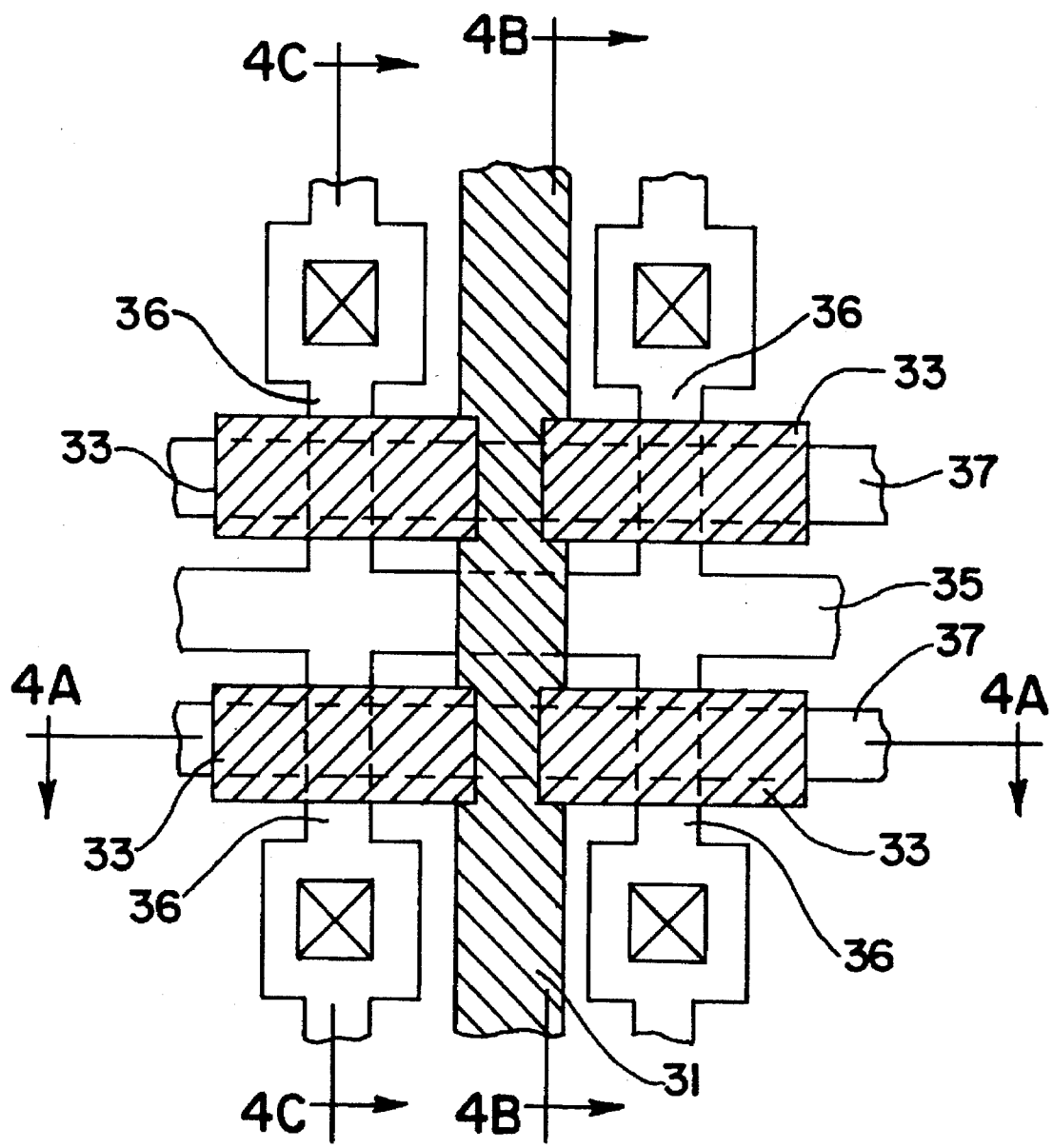
FIG. 3 illustrates the layout of an EEPROM flash memory device according to the present invention.
Figure 4A:
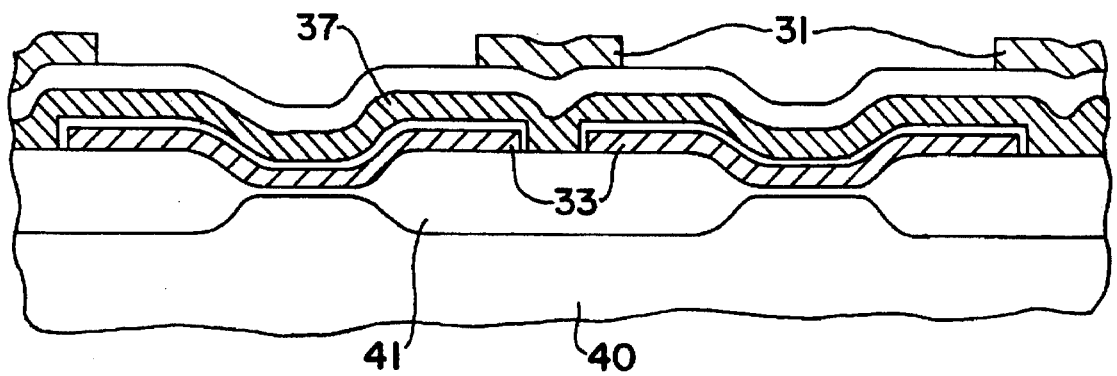
FIG. 4A is a sectional view taken along line 4A—4A of FIG. 3.
Figure 4B:
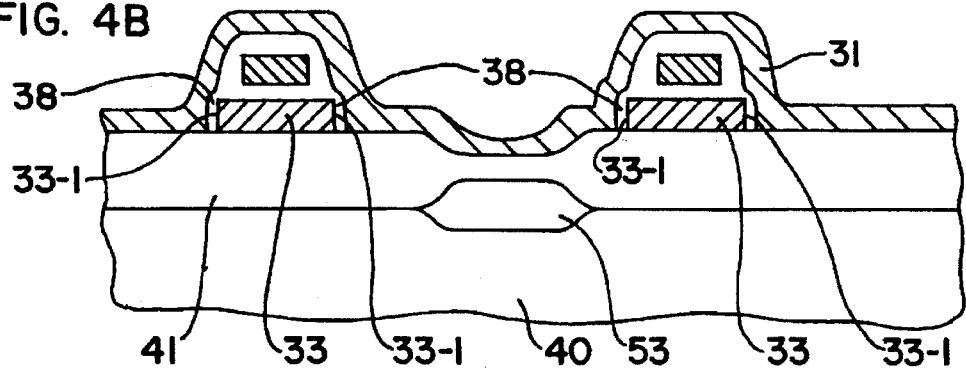
FIG. 4B is a sectional view taken along line 4B—4B of FIG. 3.
Figure 4C:
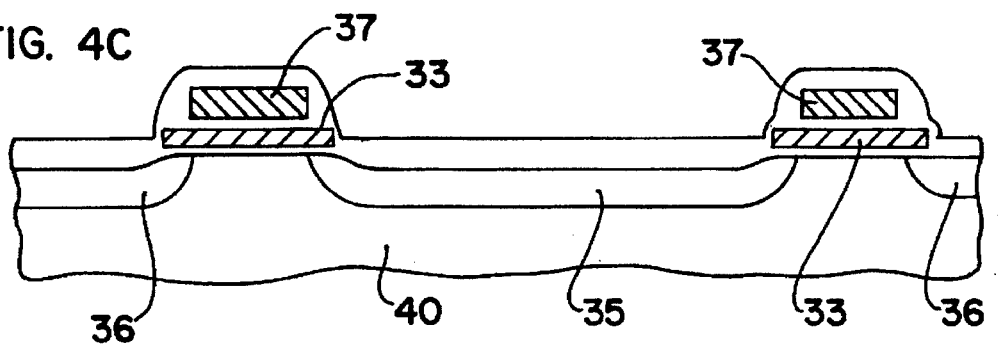
FIG. 4C is a sectional view taken along line 4C—4C of FIG. 3.

FIG. 3 illustrates the layout of an EEPROM flash memory device according to the present invention. FIG. 4A is a sectional view taken along line 4A—4A of FIG. 3, and FIG. 4B is a sectional view taken along line 4B—4B of FIG. 3. FIG. 4C is a sectional view taken along line 4C—4C of FIG. 3, and FIGS. 5A to 5F are partly sectional views taken along line 4B—4B of FIG. 3 for illustrating a preferred embodiment of a formation process according to the present invention.

The flash memory cell according to the present invention is constituted such that a plurality of sources 35 and drains 36 are arranged in a first direction, floating gate electrodes 33 are disposed between sources 35 and drains 36, and a plurality of control gate electrodes (word lines) 37 are arranged upon floating gate electrodes 33 and in a second direction. The second direction crosses the first direction.

A plurality of erasing electrodes 31 are arranged between the floating gate electrodes of the cells in the first direction, in such a manner that the erasing electrodes are partly (cross-hatched portion) overlapped with the floating gate electrodes.

Figure 5A:
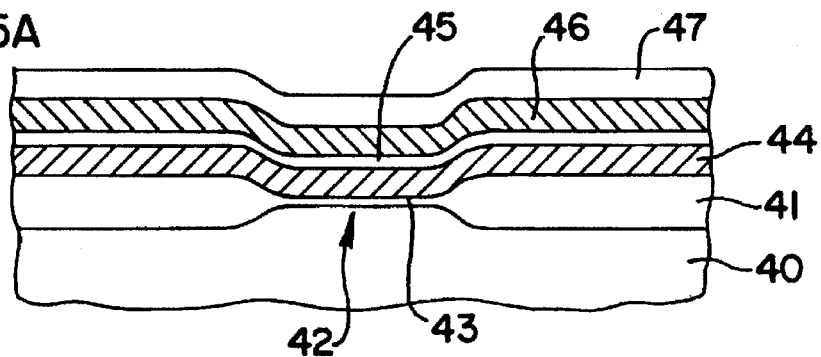
FIGS. 5A to 5F are partly sectional views taken along line 4B—4B of FIG. 3 for illustrating a preferred embodiment of a formation process according to the present invention.

Erasing electrode 31 meets with opposite sides 33-1 of the floating gate electrode across thin insulating layer 38 (see FIG. 4B). Depending on deviations occurring during the formation process, the erasing electrode meets with both sides or the left or right side of the floating gate electrode. In the drawings, reference code 40 indicates a semiconductor substrate, and reference code 41 indicates a field insulating layer. FIGS. 5A to 5(F are partly sectional views taken along line 4B—4B of FIG. 3 for illustrating a formation process according to the present invention.

As illustrated in FIG. 5A, first field region 41 and element region (or active region) 42 are formed in a separate (apart) manner upon a semiconductor substrate. Then, gate insulating layer 43 is formed, and polysilicon layer 44 as a conduction layer for the floating gate electrode is deposited thereupon. Parts thereof are etched off by applying a photo etching process to form a plurality of stripe-type patterns in the first direction (refer to reference code 33 of FIG. 4A).

Thereafter, intermediate insulating layer 45 is deposited, and thereupon polysilicon layer 46 and upper insulating layer 47 are successively deposited so as to serve as conduction layers for the control gate.

Silicon oxide is grown to as much as about 7000 Angstroms so as to serve as an insulating layer for the field region, and silicon oxide is grown to about 150 to 400 Angstroms so as to serve as a gate insulating layer. Polysilicon is deposited to a thickness of about 1000 to 3000 Angstroms to form a conduction layer for the floating gate electrode, and an impurity is doped by applying an ion-implantation method or an in-situ doping method. An intermediate insulating layer is provided in the form of O—N—O stacked layer 45, and the effective thickness of this stacked layer is made to be about 150 to 400 Angstroms. Further, polysilicon 46 is deposited to a thickness of about 3000 Angstroms to form the conduction layer for the control gate. The doping method here may be the same as that for the polysilicon for the floating gate electrode. CVD oxide layer 47 is deposited to a thickness of about 3000 Angstroms to form an upper insulating layer.

Figure 5B:
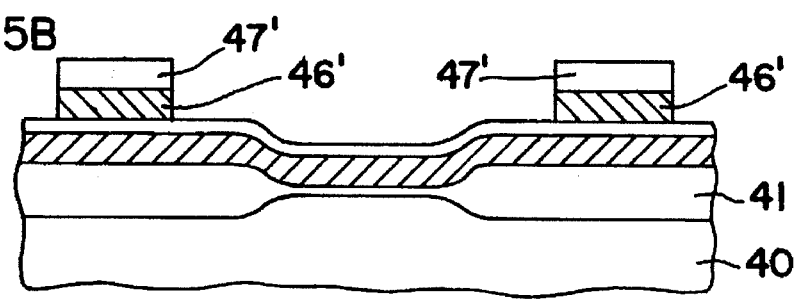

After completing the above processes, the control gate is defined by applying a photo-etching process as illustrated in FIG. 5B, and upper insulating layer 47 and control gate polysilicon layer 46 are etched by using intermediate insulating layer 45 as an etch stop layer, thereby forming control gate electrode 46' in the second direction.

Figure 5C:
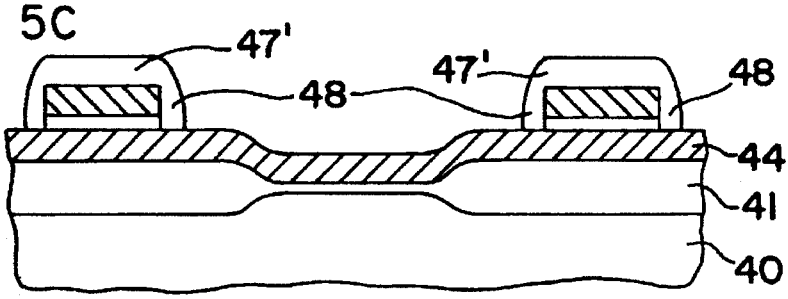

Thereafter, as illustrated in FIG. 5C, a CVD oxide layer is deposited to a thickness of about 3000 Angstroms, and an etch-back is carried out to form control gate side wall insulating layer 48.

Figure 5D:
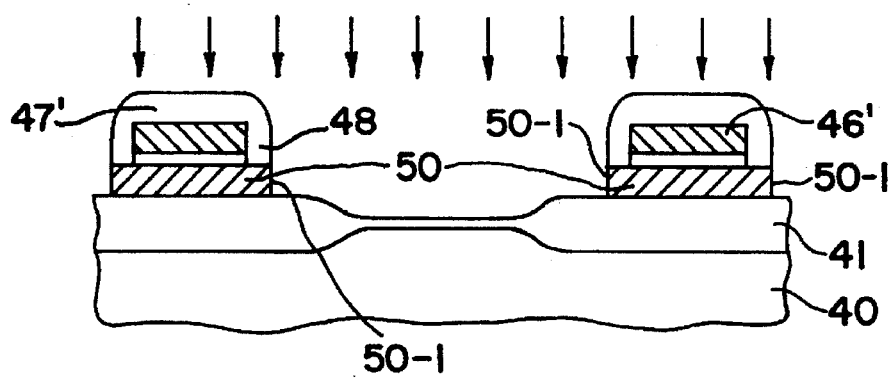

As illustrated in FIG. 5D, polysilicon layer 44 for the floating gate is etched by using side insulating layer 48 and upper insulating layer 47' of the control gate as a mask, thereby forming floating gate electrode 50. A high concentration impurity is ion-implanted.

Figure 5E:
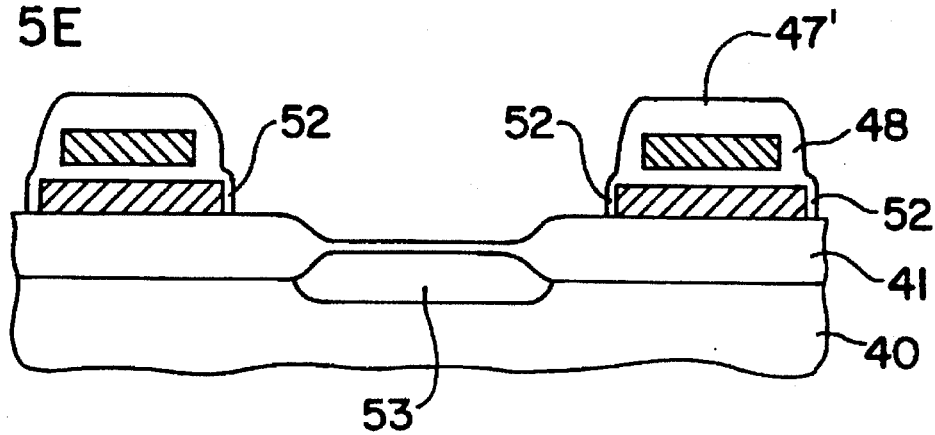
Figure 5F:
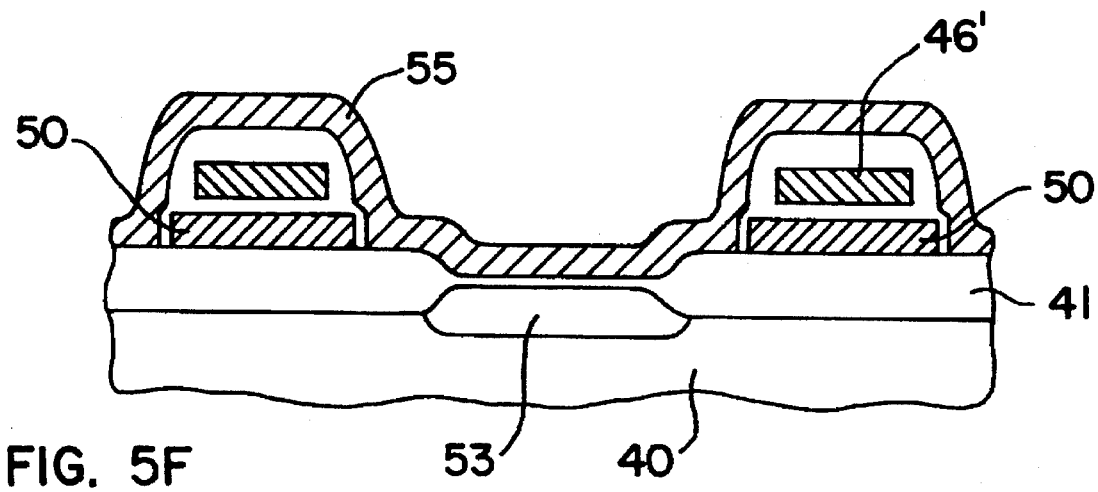

Thereafter, as illustrated in FIG. 5E, a thermal oxidation process is performed. Thus, tunneling insulating layer (oxide) 52 is grown on exposed portion 50-1 (see FIG. 5D) of floating gate electrode 50 to a thickness of about 200 to 500 Angstroms. The implanted ions are diffused and annealed to form N+ common source line 53 and a source-drain region (36 in FIG. 4C). Upon these layers, a thick oxide layer is formed to a thickness of about 1000 Angstroms.

Here, the tunneling insulating layer is a silicon oxide film which is formed by thermally oxidizing polysilicon, and, therefore, electrons may tunnel well.

Thereafter, polysilicon is deposited to a thickness of about 2000 to 4000 Angstroms for forming an erasing electrode, and a patterning is carried out by applying a photo etching process to form a plurality of erasing electrodes 55 in the direction perpendicular to control gate 46' (the first direction).

Erasing electrode 55 is insulated, and the device is completed by applying usual processes.

When programming memory cells of the present invention constituted as described above, a high voltage is supplied to the control gate and to the source or drain, so that hot electrons should be formed in the channel, with the hot electrons thus formed captured in the floating gate after passing through the gate oxide, thereby achieving programming.

For example, when writing, a voltage of about 7 to 8 volts is supplied between the source and drain, and a voltage of about 12 to 13 volts is supplied to the control gate, so that hot electrons should be produced in the channel between the source and drain. These hot electrons are pulled by the electric field established by the voltage supplied to the control gate. Accordingly, the electrons pass through the gate insulating layer and are injected into the floating gate.

Thus, the floating gate is charged with negative charges, with the result that the threshold voltage of the transistor is raised. Therefore, the transistor is not turned on by the normal control gate voltage, and the transistor remains turned off during normal operation.

When erasing, a high positive voltage is supplied to the erasing electrode and the control gate, the drain and the source are grounded, so that electrons captured in the floating gate may escape from the erasing electrode through tunneling oxide layer 52, thereby erasing the programmed information. That is, the negative charges stored in the floating gate are dissipated, and, as a result, the threshold voltage of the transistor is lowered.

According to the present invention as described above, a solution is provided for the problem of junction breakdown occurring in source 12 when erasing the programmed data. Further, a solution is provided for the problem that hot holes which have received energy from the electric field in the deep depletion region in the source during the erase operation are injected into the gate insulation layer and captured there, thereby increasing the tunneling current drastically. Further, a solution is provided for the problem that the threshold voltage is varied too much due to the existence of the above mentioned hot holes. Furthermore, there is no necessity of using a thin tunnel oxide (about 100 Angstroms) for the gate oxide because erasing is performed by the electron tunnelling from the floating gate to the erase gate, which will significantly help improve the yield.

Although various preferred embodiments of the present invention have been disclosed for illustrative purposes, those skilled in the art will appreciate that various modifications, additions and/or substitutions are possible without departing from the scope and spirit of the present invention as defined in the claims.

What is claimed is:

1. A process for forming an EEPROM flash memory device on a semiconductor substrate, comprising the steps of:

(1) forming a field region and an active region upon a semiconductor substrate, forming a gate insulating layer, and forming a plurality of patterns of a floating gate electrode conduction layer in a first direction;

(2) forming an intermediate insulating layer, and forming a control gate conduction layer and an upper insulating layer;

(3) defining a control gate electrode, and etching the upper insulating layer and the control gate conduction layer utilizing the intermediate insulating layer as an etch stop layer to form a control gate electrode in a second direction;

(4) forming an insulating layer, and etching back the insulating layer, wherein a side wall insulating layer is formed on the side walls of the control gate electrode;

(5) etching the floating gate conduction layer utilizing the upper insulating layer and the side wall insulating layer of tile control gate as a mask to form a floating gate electrode;

(6) ion-implanting ions, and forming a tunneling insulating layer on side portions of the floating gate electrode, and forming an N+ common source line and respective drain regions through diffusion of the implanted ions; and (7) forming an erasing electrode conduction layer, and patterning the erasing electrode conduction layer to form an erasing electrode in a direction elongated perpendicular to the control gate electrode, wherein the tunneling insulating layer is interposed between the erasing electrode and the floating gate electrode.

2. The process of claim 1, wherein the gate insulating layer comprises silicon oxide of a thickness of about 150 to 400 Angstroms, and the tunneling insulating layer comprises silicon oxide of a thickness of about 200 to 500 Angstroms.

3. The process of claim 1, wherein the floating gate electrode conduction layer is formed by depositing polysilicon to a thickness of about 1000 to 3000 Angstroms, and by ion-implanting an impurity or by doping with an in-situ method.

4. The process of claim 1, wherein the intermediate insulating layer comprises an ONO stacked layer having an effective oxide thickness of about 150 to 400 Angstroms.

5. The process of claim 1, wherein the control gate conduction layer is formed by depositing polysilicon to a thickness of about 3000 Angstroms, and by ion-implanting an impurity or by doping with an in-situ method.

6. The process of claim 1, wherein the erasing electrode conduction layer is formed by depositing polysilicon to a thickness of about 2000 to 4000 Angstroms, and a plurality of erasing electrodes are formed in direction perpendicular to that of the control gate line.

7. A process for forming an EEPROM flash memory cell upon a semiconductor substrate, comprising the steps of:

(1) forming a field region and an active region on a semiconductor substrate, forming a gate insulating layer, and forming a pattern of a floating gate electrode conduction layer;

(2) forming an intermediate insulating layer, and depositing a control gate conduction layer and an upper insulating layer;

(3) defining a control gate electrode, and etching the upper insulating layer and the control gate conduction layer by using the intermediate insulating layer as an etch stop layer to form a control gate electrode;

(4) forming an insulating layer, etching the insulating layer back to form a side wall insulating layer on the side walls of the control gate electrode;

(5) etching the floating gate conduction layer by using the upper insulating layer and the side wall insulating layer and the control gate as a mask to form a floating gate electrode;

(6) ion-implanting ions, forming a tunneling insulating layer on side portions of the floating gate electrode, and forming an N+ source and drain region through diffusion of the implanted ions; and (7) forming an erasing electrode conduction layer, and forming an erasing electrode by applying a photo etching process, wherein the erasing electrode is formed elongated perpendicularly to the control gate electrode, and wherein the tunneling insulating layer is interposed between the erasing electrode and the floating gate electrode.

8. The process of claim 7, wherein the gate insulating layer comprises silicon oxide of a thickness of about 150 to 400 Angstroms, and the tunneling insulating layer comprises silicon oxide of a thickness of about 200 to 500 Angstroms.

9. The process of claim 7, wherein the floating gate electrode conduction layer is formed by depositing polysilicon to a thickness of about 1000 to 3000 Angstroms, and by ion-implanting an impurity or by doping with an in-situ method.

10. A process for forming an EEPROM flash memory cell upon a semiconductor substrate, comprising the steps of:

(1) forming a field region and an active region on a semiconductor substrate, forming a gate insulating layer, and patterning a floating gate electrode conduction layer;

(2) forming an intermediate insulating layer, and forming a control gate conduction layer and an upper insulating layer;

(3) defining a control gate electrode, and etching the upper insulating layer and the control gate conduction layer to form a control gate electrode;

(4) forming a side wall insulating layer on the side walls of the control gate electrode;

(5) etching the floating gate conduction layer to form a floating gate electrode using the upper insulating layer and the side wall insulating layer and the control gate as a mask;

(6) implanting an impurity, and forming a tunneling insulating layer on side portions of the floating gate electrode, wherein the implanted impurity forms source and drain regions; and (7) forming an erasing electrode, wherein the erasing electrode is formed elongated perpendicularly to the control gate electrode, and wherein the tunneling insulating layer is interposed between the erasing electrode and the floating gate electrode.

11. The process of claim 10, wherein the gate insulating layer comprises silicon oxide of a thickness of about 150 to 400 Angstroms, and the tunneling insulating layer comprises silicon oxide of a thickness of about 200 to 500 Angstroms.

12. The process of claim 10, wherein the floating gate electrode conduction layer is formed by depositing polysilicon to a thickness of about 1000–3000 Angstroms, and by ion-implanting an impurity or by doping with an in-situ method.

* * * * *